United States Patent
Wang et al.

(10) Patent No.: US 11,776,296 B2
(45) Date of Patent: Oct. 3, 2023

(54) ULTRASONIC FINGERPRINT RECOGNITION CIRCUIT, METHOD FOR DRIVING SAME, AND DISPLAY DEVICE

(71) Applicant: BOE Technology Group Co., Ltd., Beijing (CN)

(72) Inventors: Bo Wang, Beijing (CN); Fuqiang Li, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 83 days.

(21) Appl. No.: 17/506,522

(22) Filed: Oct. 20, 2021

(65) Prior Publication Data

US 2022/0277157 A1    Sep. 1, 2022

(30) Foreign Application Priority Data

Mar. 1, 2021    (CN) .......................... 202110225761.7

(51) Int. Cl.
*G06V 40/13*    (2022.01)
*H01L 25/18*    (2023.01)
*H10K 59/65*    (2023.01)

(52) U.S. Cl.
CPC .......... *G06V 40/1306* (2022.01); *H01L 25/18* (2013.01); *H10K 59/65* (2023.02)

(58) Field of Classification Search
CPC ..... G06V 40/1306; H01L 25/18; H10K 59/65
See application file for complete search history.

(56) References Cited

U.S. PATENT DOCUMENTS

| | | | |
|---|---|---|---|
| 2017/0177934 A1* | 6/2017 | Ran | G06V 40/1347 |
| 2018/0219514 A1* | 8/2018 | Schober | H01L 29/423 |
| 2021/0200973 A1* | 7/2021 | Huang | G06F 3/0443 |
| 2021/0350098 A1* | 11/2021 | Zhou | G06F 3/045 |

* cited by examiner

*Primary Examiner* — Jonathan A Boyd
(74) *Attorney, Agent, or Firm* — IPRO, PLLC

(57) ABSTRACT

Disclosed is an ultrasonic fingerprint recognition circuit. In the ultrasonic fingerprint recognition circuit, an ultrasonic sensor generates an AC echo signal based on an echo signal upon the fingerprint detection, and a signal converting unit converts the AC echo signal to a DC signal and transmit the DC signal to the signal output unit to generate a fingerprint recognition signal by a signal output unit.

19 Claims, 10 Drawing Sheets

ULTRASONIC FINGERPRINT RECOGNITION CIRCUIT, METHOD FOR DRIVING SAME, AND DISPLAY DEVICE

CROSS-REFERENCE TO RELATED APPLICATION

This application is based on and claims priority to the Chinese Patent Application No. 202110225761.7, filed on Mar. 1, 2021 and entitled "ULTRASONIC FINGERPRINT RECOGNITION CIRCUIT, METHOD FOR DRIVING SAME, FINGERPRINT RECOGNITION UNIT AND DISPLAY DEVICE," the disclosure of which is herein incorporated by reference in its entirety.

TECHNICAL FIELD

The present disclosure relates to the field of fingerprint recognition technologies, and more particularly to an ultrasonic fingerprint recognition circuit, a method for driving the same, and a display device.

BACKGROUND

The fingerprint recognition technology authenticates users based on fingerprints, thereby improving security of a display device. As a new fingerprint recognition solution, the ultrasonic fingerprint recognition technology has gradually drawn attentions of people. Due to the strong penetration of ultrasonic waves, the fingerprints can be identified even in the case that water stains and/or contaminant stains are present on the surface of the finger. Therefore, the ultrasonic fingerprint recognition technology is becoming more and more widely applied.

SUMMARY

In view of this, the present disclosure is intended to provide an ultrasonic fingerprint recognition circuit, a method for driving the same, and a display device.

In one aspect of embodiments of the present disclosure, an ultrasonic fingerprint recognition circuit is provided. The ultrasonic fingerprint recognition circuit includes:

an ultrasonic sensor, wherein the ultrasonic sensor is configured to generate an ultrasonic signal for fingerprint detection based on an input signal, and generate an AC echo signal based on an echo signal formed by reflection of the ultrasonic signal by a fingerprint;

a signal converting unit, wherein one end of the signal converting unit is connected to the ultrasonic sensor, and the signal converting unit is configured to receive the AC echo signal and convert the AC echo signal to a DC signal; and a signal output unit, wherein the other end of the signal converting unit is connected to the signal output unit, and the signal output unit is configured to receive the DC signal and generate a fingerprint recognition signal based on the DC signal.

In some embodiments, the ultrasonic sensor includes: a transmit electrode, a receive electrode, and a piezoelectric layer disposed between the transmit electrode and the receive electrode;

wherein the transmit electrode is configured to receive the input signal and input a first voltage to the piezoelectric layer based on the input signal, and the input signal is an AC signal;

wherein the piezoelectric layer is configured to generate and transmit the ultrasonic signal in response to the first voltage and a second voltage on the receive electrode, and generate a voltage variation relative to the first voltage in response to the echo signal formed by the reflection of the ultrasonic signal by the fingerprint; and the receive electrode is connected to the signal converting unit, and the receive electrode is configured to generate the AC echo signal based on the voltage variation, and output the AC echo signal to the signal converting unit.

In some embodiments, the signal converting unit includes: an inverter; and the inverter is respectively connected to a first voltage signal terminal and a second voltage signal terminal, and the inverter is configured to convert the AC echo signal to the DC signal based on a first voltage signal input by the first voltage signal terminal and a second voltage signal input by the second voltage signal terminal.

In some embodiments, the inverter includes a first field-effect transistor and a second field-effect transistor; wherein a control electrode of the first field-effect transistor is connected to the ultrasonic sensor, a first electrode of the first field-effect transistor is connected to the first voltage signal terminal, and a second electrode of the first field-effect transistor is connected to the signal output unit; and a control electrode of the second field-effect transistor is connected to the ultrasonic sensor, a first electrode of the second field-effect transistor is connected to the second voltage signal terminal, and a second electrode of the second field-effect transistor is connected to the signal output unit.

In some embodiments, in the first field-effect transistor and the second field-effect transistor, one field-effect transistor is a P-type field-effect transistor and the other field-effect transistor is an N-type field-effect transistor.

In some embodiments, the control electrode of first field-effect transistor and the control electrode of the second field-effect transistor are both gates;

in the first electrode of the first field-effect transistor and the second electrode of the first field-effect transistor, one is a source and the other is a drain; and in the first electrode of the second field-effect transistor and the second electrode of the second field-effect transistor, one is a source and the other is a drain.

In some embodiments, the signal output unit is further connected to a third voltage signal terminal and a fourth voltage signal terminal respectively, and the signal output terminal is configured to generate the fingerprint recognition signal based on the DC signal, a third voltage signal input by the third voltage signal terminal, and a fourth voltage signal input by the fourth voltage signal terminal, and send the fingerprint recognition signal to a signal output terminal of the signal output unit.

In some embodiments, the signal output unit includes a first thin-film transistor and a second thin-film transistor; wherein a control electrode of the first thin-film transistor is connected to the signal converting unit, a first electrode of the first thin-film transistor is connected to the third voltage signal terminal, and a second electrode of the first thin-film transistor is connected to a first electrode of the second thin-film transistor; and a control electrode of the second thin-film transistor is connected to the fourth voltage signal terminal, and a second electrode of the second thin-film transistor is connected to the signal output terminal.

In some embodiments, both the control electrode of the first thin-film transistor and the control electrode of the second thin-film transistor are gates;

in the first electrode of the first thin-film transistor and the second electrode of the first thin-film transistor, one is a source and the other is a drain; and among the first electrode of the second thin-film transistor and the second electrode of the second thin-film transistor, one is a source and the other is a drain.

In another aspect of embodiments of the present disclosure, a method for driving an ultrasonic fingerprint recognition circuit is provided, which is applicable to the ultrasonic fingerprint recognition circuit. The ultrasonic fingerprint recognition circuit includes: an ultrasonic sensor, a signal converting unit, and a signal output unit, wherein one end of the signal converting unit is connected to the ultrasonic sensor, and the signal output unit is connected to the other end of the signal converting unit. The method includes:

in a transmission phase, generating an ultrasonic signal for fingerprint detection by the ultrasonic sensor based on an input signal; and in a reception phase, receiving an echo signal formed by the reflection of a fingerprint on the ultrasonic signal by the ultrasonic sensor, and generating an AC echo signal based on the echo signal; receiving the AC echo signal by the signal converting unit and converting the AC echo signal to a DC signal; and receiving the DC signal by the signal output unit, and generating a fingerprint recognition signal based on the DC signal.

In still another aspect of embodiments of the present disclosure, a display device including a display module and a fingerprint recognition unit is provided. The fingerprint recognition unit is attached to either a light emitting surface or a backlight surface of the display module. The fingerprint recognition unit includes: an ultrasonic fingerprint recognition circuit. The ultrasonic fingerprint recognition circuit includes:

an ultrasonic sensor, wherein the ultrasonic sensor is configured to generate an ultrasonic signal for fingerprint detection based on an input signal, and generate an AC echo signal based on an echo signal formed by reflection of the ultrasonic signal by a fingerprint;

a signal converting unit, wherein one end of the signal converting unit is connected to the ultrasonic sensor, and the signal converting unit is configured to receive the AC echo signal and convert the AC echo signal to a DC signal; and a signal output unit, wherein the signal output unit is connected to the other end of the signal converting unit, and the signal output unit is configured to receive the DC signal and generate a fingerprint recognition signal based on the DC signal.

In some embodiments, the fingerprint recognition unit includes a fingerprint recognition backplane and an ultrasonic sensor film layer that are disposed on a side of the display module and are sequentially stacked.

In some embodiments, the fingerprint recognition backplane is disposed on a side of the display module, and the ultrasonic sensor film layer is disposed on a side, distal from the display module, of the fingerprint recognition backplane.

In some embodiments, the ultrasonic sensor film layer is disposed on a side of the display module, and the fingerprint recognition backplane is disposed on a side, distal from the display module, of the ultrasonic sensor film layer.

In some embodiments, the display module includes a display substrate, a pixel driving circuit unit, and a light emitting unit that are sequentially stacked;

the light emitting unit includes an anode layer, a light emitting layer, and a cathode layer that are sequentially stacked along a direction away from the pixel driving circuit unit; and the fingerprint recognition backplane and the ultrasonic sensor film layer are disposed between the display substrate and the cathode layer.

In some embodiments, the fingerprint recognition backplane includes a signal converting unit and a signal output unit; and the ultrasonic sensor film layer includes a transmit electrode disposed on a side of the fingerprint recognition backplane, a receive electrode disposed between the fingerprint recognition backplane and the transmit electrode, and a piezoelectric layer disposed between the transmit electrode and the receive electrode.

In some embodiments, the transmit electrode and the receive electrode are disposed in one-to-one correspondence, and an orthographic projection of the transmit electrode onto the display substrate covers an orthographic projection of the receive electrode onto the display substrate.

In some embodiments, the fingerprint recognition unit is attached to a light-emitting surface of the display module; and both an orthographic projection of the receive electrode onto the display substrate and an orthographic projection of the transmit electrode onto the display substrate are not overlapped with an orthographic projection of the light emitting unit onto the display substrate.

In some embodiments, the ultrasonic sensor film layer further includes a thin film encapsulation layer disposed on a side, distal from the receive electrode, of the transmit electrode.

BRIEF DESCRIPTION OF THE DRAWINGS

To describe the technical solutions in the present disclosure or in the related art more clearly, the following briefly introduces the accompanying drawings required for describing the embodiments or the related art. Apparently, the accompanying drawings in the following description show merely some embodiments of the present disclosure, and persons of ordinary skill in the art may still derive other accompanying drawings from these accompanying drawings without creative efforts.

REFERENCE NUMERALS AND DENOTATIONS THEREOF

Figure 1:
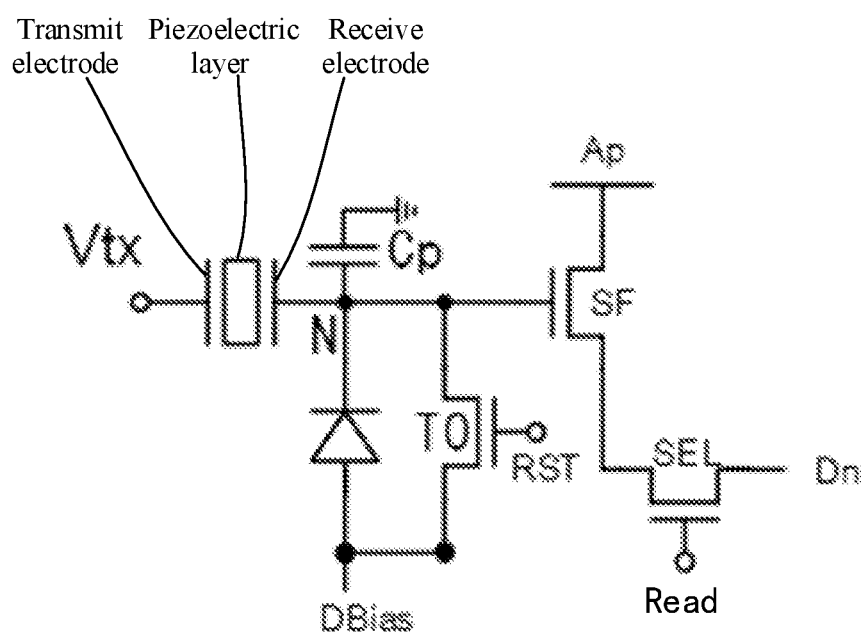
FIG. 1 is a schematic circuit structural diagram of an ultrasonic fingerprint recognition circuit in the related art.

1—ultrasonic sensor, 2—signal converting unit, 3—signal output unit;
11—transmit electrode, 12—piezoelectric layer, 13—receive electrode, 21—inverter, 10—signal input terminal, 30—signal output terminal, 22—first voltage signal terminal, 23. second voltage signal terminal, 33—third voltage signal terminal, 34—fourth voltage signal terminal, 211—first field-effect transistor, 212—second field-effect transistor, 31—first thin-film transistor, 32—second thin-film transistor;
5—display module, 100—fingerprint recognition unit; and
4—fingerprint recognition backplane, 6—ultrasonic sensor film layer, 51—display substrate, 59—cathode layer, 14—thin film encapsulation layer.

DETAILED DESCRIPTION

For clearer descriptions of the objectives, technical solutions, and advantages of the embodiments of the present disclosure, the embodiments of the present disclosure are described clearly hereinafter in combination with the specific embodiments and the accompanying drawings.

It should be noted that, unless otherwise defined, technical terms or scientific terms used in the embodiments of the present disclosure shall have ordinary meaning understood by persons of ordinary skill in the art to which the embodiments of the present disclosure belong. The terms "first," "second," and the like used in the embodiments of the present disclosure are not intended to indicate any order, quantity, or importance, but are merely used to distinguish different components. The terms "include," "comprise," and derivatives thereof are used to indicate that the element or object preceding the terms covers the element or object following the terms and its equivalents, and shall not be understood as excluding other elements or objects. The terms "connection" or "connected" and the like are not intended to be limited to physical or mechanical connections, but may include electrical connections, either direct or indirect connection. The terms "up," "down," "left," "right," and the like are merely used to denote relationship of relative position, which may also be changed accordingly in the case that the absolute position of the described object is changed.

Fingerprint recognition refers to identification by comparing minutiae characteristics of different fingerprints. As different people have different fingerprints, and the fingerprints of each finger of each person's ten fingers are obviously different, the fingerprint may be used for identification, and the lifetime immutability, uniqueness and convenience of the fingerprint have almost become synonym for biometric recognition. The fingerprint is a unique feature of the human body and are extremely difficult to be cracked. In this case, a scan speed of the fingerprint recognition is fast and is used in mobile display device such as mobile phones or electronic book, which undoubtedly makes unlocking and mobile payment of the mobile phone safer, more convenient and faster.

Fingerprint recognition technology is a current mainstream biometric recognition approach, and its application popularity far exceeds other recognition methods, such as iris recognition, vein recognition, or face recognition. Moreover, with the further development of the industrial design, requirements for fingerprint recognition technology are getting higher and higher, and traditional fingerprint recognition technology (such as fingerprint unlocking technology) cannot meet the more demanding process level requirements.

Figure 2:
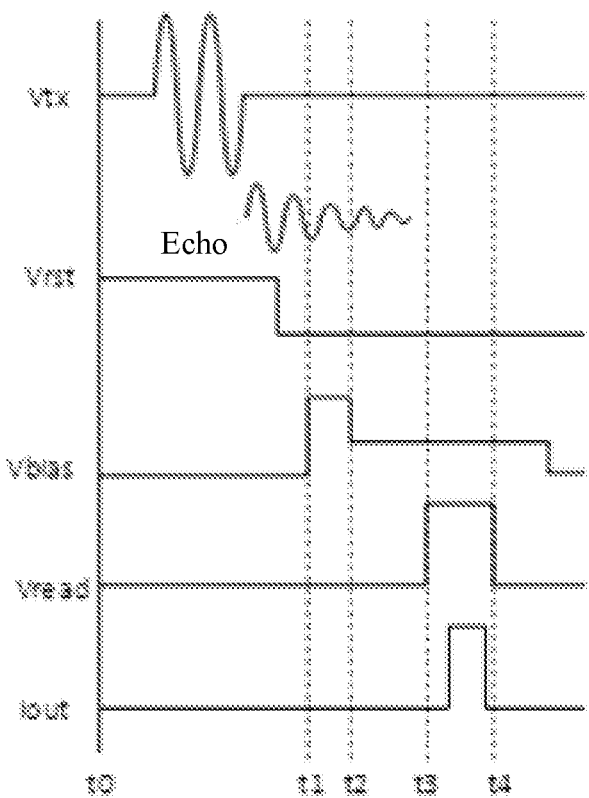
FIG. 2 is a schematic operational timing diagram of an ultrasonic fingerprint recognition circuit in the related art.

FIG. 1 is a schematic circuit structural diagram of an ultrasonic fingerprint recognition circuit in the related art. FIG. 2 is a schematic operational timing diagram of an ultrasonic fingerprint recognition circuit in the related art.

In a transmission phase between t0 and t1, a potential of a reset signal Vrst provided by a RST signal terminal that is connected to the ultrasonic fingerprint recognition circuit is a high potential (i.e., a voltage is high), and a potential of a signal Vbias provided by a Dbias signal terminal that is connected to the ultrasonic fingerprint recognition circuit is a low potential (i.e., a voltage is low). In this case, a transistor TO included in the ultrasonic fingerprint recognition circuit is turned on, and a receive electrode of a ultrasonic sensor (i.e., at a receiving node N) is biased to a fixed potential, such as 0, a transmit electrode of the ultrasonic sensor receives an AC signal vtx provided by a connected AC signal terminal Vtx, and a piezoelectric layer disposed between the receive electrode and the transmit electrode vibrates to transmit ultrasonic waves.

In a sampling phase between t1 and t2, the potential of the reset signal Vrst hops to a low potential (that is, the voltage hops to a low level), the potential of the signal Vbias is briefly pulled high to charge the receiving node N, and a charging voltage is stored on a parasitic capacitor Cp. The piezoelectric layer receives an echo and outputs the ultrasonic echo signal to the receive electrode, and the final potential is affected by the ultrasonic echo signal.

In a holding phase between t2 and t3, the potential of the signal Vbias is appropriately biased to a potential between the high potential in the sampling phase and the low potential in the transmission phase. In this way, the leakage current of the transistor T0 may be minimized.

In a read-out phase between t3 and t4, a potential of the signal Vread provided by a signal terminal Read that is connected to a gate of a transistor SEL is pulled up, and the transistor SEL is turned on. In this case, the potential at the receiving node N is transformed into a voltage signal for fingerprint recognition through the switch SF, and output to the outside through a signal output terminal Dn of the transistor SEL.

In the ultrasonic fingerprint recognition circuit described above, due to the characteristics of the material of the piezoelectric layer, in the case that the voltage of the AC signal vtx provided by the AC signal terminal Vtx is about 200 volts (V), the voltage transmitted to the receiving node N through the piezoelectric layer is only about 1V and the signal loss is large. As the ultrasonic echo signal is an AC signal, which includes a positive voltage and a negative voltage, and the negative voltage cannot turn on the switch SF, in order to turn on the switch SF, a bootstrap voltage input by the Dbias signal terminal is required to lift the ultrasonic echo signal to a positive voltage signal, thereby successfully turning on the switch SF to output a voltage signal for fingerprint recognition. In this case, in order to ensure that the switch SF can be turned on smoothly and output a current signal Tout for fingerprint recognition, the following requirements need to be met. The Vbias signal provided by the Dbias signal terminal which provides the bootstrap voltage is required to be a global signal, with a high bandwidth, such as a square wave of 50 nanoseconds (ns), a small trace delay and a complete waveform. A signal provided by a signal terminal Ap that is connected to the switch SF is required be a global signal, an array power supply is required to be provided, and the resistance is required to be small. The reset signal terminal RST is connected to the next row of ultrasonic fingerprint recognition circuit, and the resistance is required to be small. The signal output terminal Dn is required to be led out from each column, and the trace should be as short as possible and the noise should be as small as possible. All above requirements increase the process complexity of manufacturing the ultrasonic fingerprint recognition circuit, and increase the process difficulty of circuit fabrication.

During practice of the embodiments of the present disclosure, the applicant has found that, where no new signal terminal Dbias is required to provide the bootstrap voltage, the AC signal of the ultrasonic echo signal can be directly processed to convert the ultrasonic echo signal from an AC signal to a DC signal, and the switch SF can be turned on without losing the negative voltage signal in the AC signal, the accuracy of the fingerprint recognition function can be ensured and the process difficulty can be reduced. The technical solutions of the embodiments of the present disclosure are further described in detail by specific embodiments hereinafter.

Figure 3:
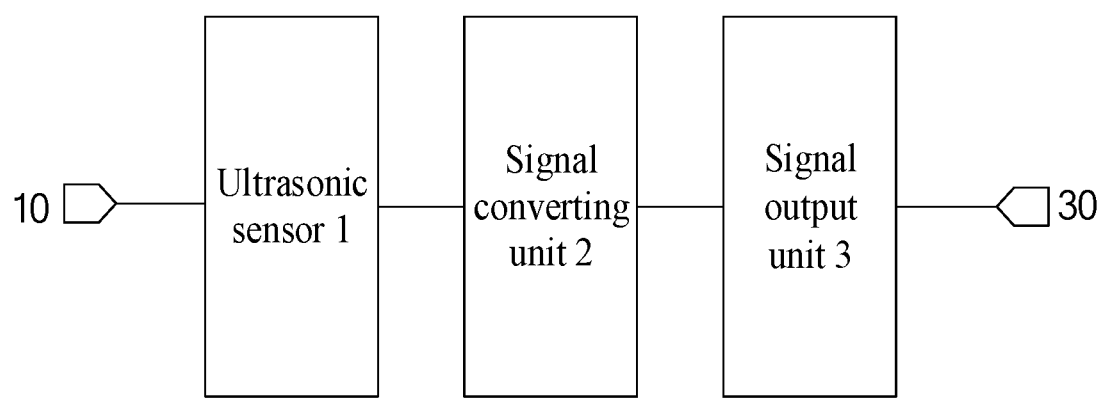
FIG. 3 is a schematic structural diagram of an ultrasonic fingerprint recognition circuit according to an embodiment of the present disclosure.

FIG. 3 is a schematic structural diagram of an ultrasonic fingerprint recognition circuit according to an embodiment of the present disclosure. As shown in FIG. 3, the ultrasonic fingerprint recognition circuit according to one or more embodiments of the present disclosure includes: an ultrasonic sensor 1, a signal converting unit 2, and a signal output unit 3. One end of the signal converting unit 2 is connected to the ultrasonic sensor 1, and the signal output unit 3 is connected to the other end of the signal converting unit 2. That is, the ultrasonic sensor 1, the signal converting unit 2 and the signal output unit 3 may be sequentially connected in series.

Here, the ultrasonic sensor 1 is configured to generate an ultrasonic signal for fingerprint detection based on an input signal and generate an AC echo signal based on an echo signal formed by reflection of the ultrasonic signal by a fingerprint (i.e., the echo signal after fingerprint detection generates the AC echo signal).

In some embodiments, referring to FIG. 3, in the embodiments of the present disclosure, the ultrasonic sensor 1 may be connected to a signal input terminal 10 which may generate the input signal and input the input signal to the ultrasonic sensor 1, and the ultrasonic sensor 1 may receive the input signal, and then generate and transmit the ultrasonic signal based on the input signal. In the case that the ultrasonic signal reaches the finger of the user, a valley ridge portion of the fingerprint may reflect the ultrasonic signal to generate the echo signal. The echo signal can be absorbed by the ultrasonic sensor 1 to generate the AC echo signal and send the AC echo signal to the signal converting unit 2.

The signal converting unit 2 is configured to receive the AC echo signal (i.e., receive the AC echo signal transmitted by the ultrasonic sensor 1) and convert the AC echo signal to the DC signal. Then, the signal converting unit 2 may further send the DC signal to the signal output unit 3.

In some embodiments, the signal converting unit 2 may convert the positive voltage and the negative voltage in the AC echo signal. In this way, in the case that the AC echo signal is converted to the DC signal, the negative voltage portion in the AC echo signal may not be lost, such that compared with the related art, the potential of the echo signal can be amplified to an extent by directly outputting the AC echo signal to the signal output unit 3.

The signal output unit 3 is configured to receive the DC signal (i.e., the DC signal transmitted by the signal converting unit 2) and generate a fingerprint recognition signal based on the DC signal. Referring to FIG. 3, the signal output unit 3 may send the generated fingerprint recognition signal to the signal output terminal 30 of the signal output unit 3. In other words, the signal output terminal 30 may receive the fingerprint recognition signal output by the signal output unit 3. Then, the fingerprint recognition signal may be parsed and processed to implement the fingerprint recognition function.

Based on the embodiments described above, in the embodiments of the present disclosure, first, the ultrasonic sensor 1 may generate the ultrasonic signal for fingerprint detection, and generate the AC echo signal based on the echo signal after fingerprint detection. Then, the AC echo signal may be converted to the DC signal by the signal converting unit 2 and the DC signal is output to the signal output unit 3, such that the signal output unit 3 may generate the fingerprint recognition signal for fingerprint recognition. Because the signal converting unit 2 can convert both the positive voltage signal and the negative voltage signal, during conversion of the AC echo signal to the DC signal, no additional bootstrap voltage is required to convert the positive voltage and negative voltage in the AC echo signal. Furthermore, even in the case that no signal terminal Dbias that provides the bootstrap voltage is present, the negative voltage portion in the AC echo signal may not be lost, and the problem of increased process difficulty caused by the design of the signal terminal Dbias portion is correspondingly reduced, that is, the process difficulty in the circuit fabrication process is further reduced.

In summary, the embodiments of the present disclosure provide an ultrasonic fingerprint recognition circuit. In the ultrasonic fingerprint recognition circuit, the signal converting unit can directly convert the AC echo signal generated by the ultrasonic sensor based on the echo signal after fingerprint detection to the DC signal, such that the signal output unit may generate the fingerprint recognition signal based on the DC signal. In this way, compared with the related art, no additional signal terminal needs to be added to perform the operation of bootstrap voltage. On the premise of not losing the negative voltage portion, the process difficulty in the circuit fabrication is further reduced.

Figure 4:
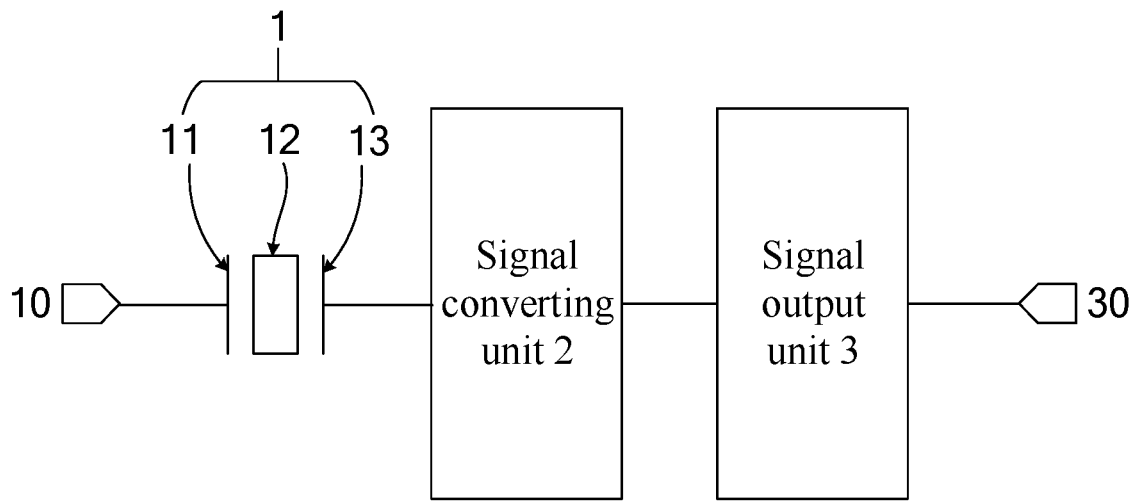
FIG. 4 is a schematic structural diagram of another ultrasonic fingerprint recognition circuit according to an embodiment of the present disclosure.

In some embodiments of the present disclosure, as shown in FIG. 4, the ultrasonic sensor 1 may include a transmit electrode 11, a receive electrode 13, and a piezoelectric layer 12 disposed between the transmit electrode 11 and the receive electrode 13.

Here, the transmit electrode 11 is configured to receive the input signal and input a first voltage to the piezoelectric layer 12 based on the input signal.

For example, as shown in FIG. 4, the transmit electrode 11 may be connected to the signal input terminal 10 and receive the input signal output by the signal input terminal 10. The input signal is the AC signal.

The piezoelectric layer 12 is configured to transmit the ultrasonic signal in response to the first voltage and a second voltage on the receive electrode 13, and generate a voltage variation relative to the first voltage in response to the echo signal formed by the reflection of the ultrasonic signal by the fingerprint.

The receive electrode 13 is connected to the signal converting unit 2, and the receive electrode 13 is configured to generate the AC echo signal based on the voltage variation, and output the AC echo signal to the signal converting unit 2.

That is, the piezoelectric layer 12 may response to the echo signal reflected by the fingerprint, generate the AC echo signal by the receive electrode 13 and output the AC echo signal to the signal converting unit 2.

In some embodiments, the transmit electrode 11 may be configured to receive the input signal which is an AC signal during the transmit phase, and input the first voltage to the piezoelectric layer 12 based on the input signal. As described in the embodiments above, the AC signal (i.e., the input signal) may be input through the signal input terminal 10. In the operation process, a residual voltage is present between the receive electrode 13 and the signal converting unit 2, thereby forming the second voltage on the receive electrode 13. Alternatively, the receive electrode 13 may also be charged to form the second voltage on the receive electrode 13. As such, the piezoelectric layer 13 may be transmitted the ultrasonic signal in the transmission phase in response to the first voltage on the transmit electrode 11 and the second voltage on the receive electrode 13. That is, the piezoelectric layer 12, based on its piezoelectric characteristics, may vibrate under the combined action of the first voltage on the transmit electrode 11 and the second voltage on the receive electrode 13, thereby generating and transmitting the ultrasonic signal. In the case that the ultrasonic signal reaches the finger of the user, the valley ridge portion of the fingerprint may reflect the ultrasonic signal to form the echo signal. In the case that the echo signal generated by the fingerprint reflection reaches the piezoelectric layer 12, the piezoelectric layer 12 may again generate a vibration and a voltage variation relative to the first voltage at an interface of the piezoelectric layer 12. The voltage variation includes a valley signal generated by a valley in the fingerprint and a ridge signal generated by a ridge in the fingerprint. The valley signal or the ridge signal generated by the piezoelectric layer 12 is received by the receive electrode 13 to generate the AC echo signal. Then, the receive electrode 13 may transmit the AC echo signal to the signal converting unit 2.

In some embodiments, a material of the piezoelectric layer 12 may include at least one of poly(1,1-difluoroethylene) (PVDF), aluminum nitride (AlN), lead zirconate titanate piezoelectric ceramics (PZT), zinc oxide (ZnO), lithium niobate (LiNbO$_3$), Quartz, potassium metaniobate (KNbO$_3$), and lithium tantalate (LiTaO$_3$). A material of the emit electrode 11 may include a metallic material such as gold (Au), molybdenum (Mo), platinum (Pt), aluminum (Al), silver (Ag), or titanium (Ti). A material of the receive electrode 13 may include Au, Mo, Pt, Al, Ag, Ti, indium-tin oxide (ITO), and the like, which is not specifically limited in the embodiments of the present disclosure.

Figure 5:
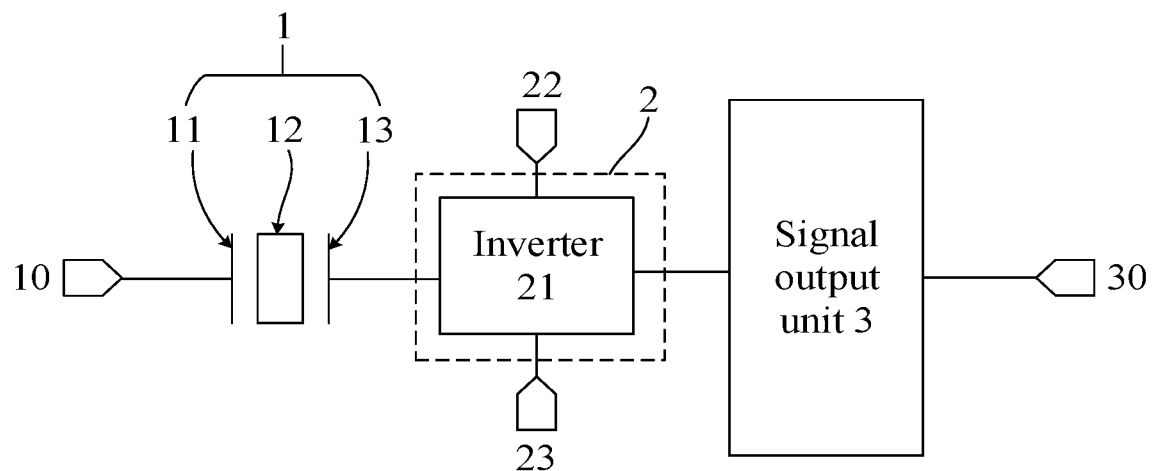
FIG. 5 is a schematic structural diagram of still another ultrasonic fingerprint recognition circuit according to an embodiment of the present disclosure.

In some embodiments of the present disclosure, as shown in FIG. 5, the signal converting unit 2 includes an inverter 21. The inverter 21 is connected to a first voltage signal terminal 22 and a second voltage signal terminal 23.

Here, the inverter 21 is configured to generate the DC signal based on the AC echo signal, the first voltage signal input by the first voltage signal terminal 22, and the second voltage signal input by the second voltage signal terminal 23.

In the embodiments of the present disclosure, the inverter can convert both the positive voltage signal and the negative voltage signal in the AC echo signal to a positive voltage signal, and the inverter can filter the signal. As such, in the case that the AC echo signal is converted to the DC signal, the positive voltage and the negative voltage in the AC echo signal can be converted without additional bootstrap voltage, such that the transistor in the signal output unit 3 can be turned on more completely. In addition, as no additional signal terminal Dbias needs to be added to lift the voltage, the process difficulty in the circuit manufacturing process is further reduced.

Figure 6:
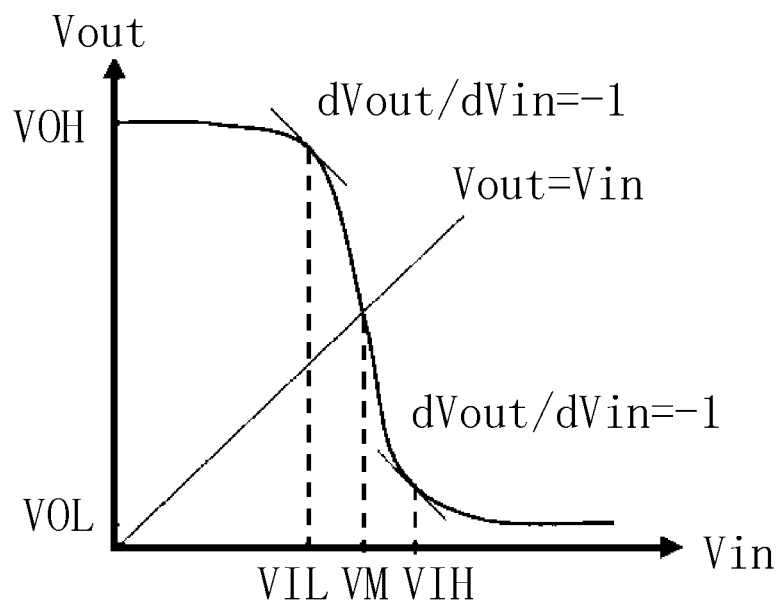
FIG. 6 is a schematic structural diagram of yet still another ultrasonic fingerprint recognition circuit according to an embodiment of the present disclosure.

In this case, as shown in FIG. 6, a transition area of the inverter is used in the embodiments of the present disclosure. That is, in the case that the voltage of the AC echo signal is between a minimum input voltage VIL and a maximum input voltage VIH of the inverter 21, the signal converting unit 2 can further amplify the voltage of the AC echo signal before outputting, that is, the DC signal output by the signal converting unit 2 also exerts an amplification effect. Further, as shown in FIG. 6, at VIL and VIH, a ratio of dVout/dVin is equal to −1, wherein Vout and Vin are the output voltage and the input voltage of the inverter 21 respectively. At the VM, the output voltage Vout of the inverter 21 is equal to the input voltage Vin (i.e., Vout=Vin). VM refers to a value between VIL and VIH.

In some embodiments, as shown in Table 1, in the case that the voltage of the first voltage signal VDD input by the first voltage signal terminal 22 is 4 V, the minimum input voltage VIL is 1.74 V. In the case that the maximum input voltage VIH is 2.32 V, the minimum output voltage VOL output by the inverter 21 can be 0 V and the maximum output voltage VOH output by the inverter 21 (i.e., the signal converting unit 2) can be 4 V. That is, the amount of variation between the minimum input voltage VIL and the maximum input voltage VIH of the AC echo signal input to the inverter 21 is 0.58 V, and the amount of variation of the DC signal output by the inverter 21 is 4 V after passing through the inverter 21. In this way, even if the AC echo signal sent by the ultrasonic sensor 1 to the signal converting unit 2 is only about 1 V, after passing through the inverter 21, a DC voltage of about 4 V can be output to the signal output unit 3, which is equivalent to an amplification effect. In this case, in the case that the DC signal continues to be input to the signal output unit 3, the control of the transistors in the signal output unit 3 may also be more sensitive due to the larger amount of variation of the DC signal, such that the accuracy of the final generated fingerprint recognition signal is also higher during the fingerprint recognition.

TABLE 1

| VDD | 4 V | 6 V | 8 V | 10 V |
|---|---|---|---|---|
| VOH/V | 4.00 | 6.00 | 8.00 | 10.00 |
| VOL/V | 0.00 | 0.00 | 0.00 | 0.00 |
| VM/V | 2.04 | 3.02 | 4.00 | 4.98 |
| VIL/V | 1.74 | 2.42 | 3.08 | 3.70 |
| VIH/V | 2.32 | 3.58 | 4.82 | 6.10 |

In some embodiments, the amplification factor for amplifying the AC echo signal through the transition area of the inverter 21 is related to the slope of the transition area of the inverter 21, and the amplified output DC signal is related to the minimum output voltage VOL and the maximum output voltage VOH of the inverter 21, and thus the adjustment of the amplification factor can be achieved by adjusting a transition zone curve of the inverter 21.

Figure 7:
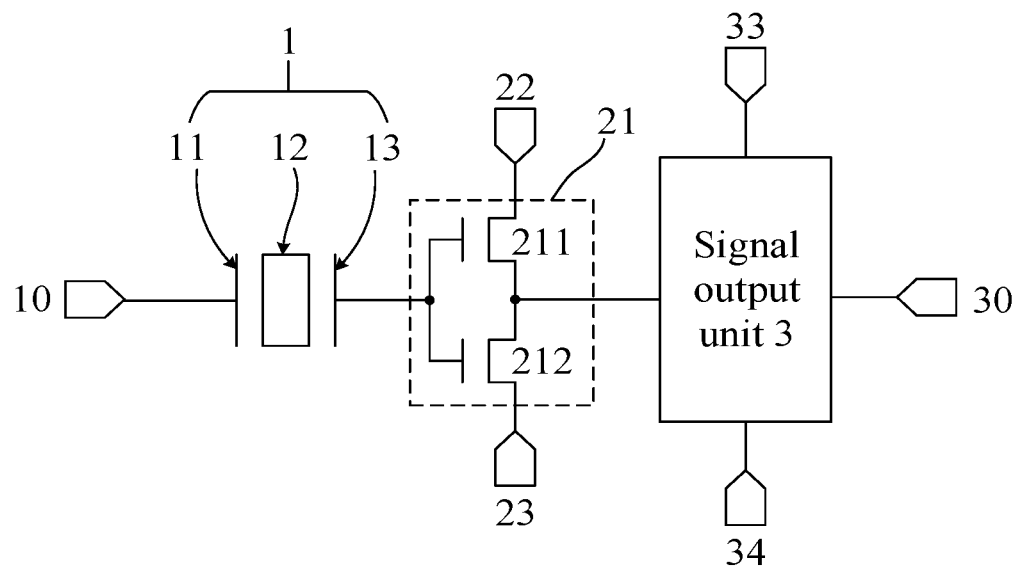
FIG. 7 is a schematic structural diagram of yet still another ultrasonic fingerprint recognition circuit according to an embodiment of the present disclosure.

In some optional embodiments of the present disclosure, as shown in FIG. 7, the inverter 21 may include a first field-effect transistor 211 and a second field-effect transistor 212.

Here, a control electrode of the first field-effect transistor 211 is connected to the ultrasonic sensor 1, a first electrode of the first field-effect transistor 211 is connected to the first voltage signal terminal 22, and a second electrode of the first field-effect transistor 211 is connected to the signal output unit 3.

A control electrode of the second field-effect transistor 212 is connected to the ultrasonic sensor 1, a first electrode of the second field-effect transistor 212 is connected to the second voltage signal terminal 23, and a second electrode of the second field-effect transistor 212 is connected to the signal output unit 3.

For example, as shown in FIG. 7, the control electrode of the first field-effect transistor 211 and the control electrode of the second field-effect transistor 212 are both connected to the receive electrode 13 of the ultrasonic sensor 1.

In some embodiments, in the first field-effect transistor 211 and the second field-effect transistor 212, one field-effect transistor is a P-type field-effect transistor, and the other field-effect transistor is an N-type field-effect transistor.

For example, as shown in FIG. 7, the first field-effect transistor 211 is a P-type field-effect transistor and the second field-effect transistor 212 is an N-type FET. On this basis, as the N-type field-effect transistor is turned on in response to the positive voltage (i.e., operating in the positive voltage state of the gate), the P-type field-effect transistor is turned on in response to the low voltage (i.e., operating in the negative voltage state of the gate). Therefore, in the case that the receive electrode 13 outputs the positive voltage in the AC echo signal, the second field-effect transistor 212 is turned on, and the second field-effect transistor 212 outputs the DC signal to the signal output unit 3 based on the AC echo signal of the positive voltage and the second voltage signal input by the connected second voltage signal terminal 23. In the case that the receive electrode 13 outputs the negative voltage in the AC echo signal, the first field-effect transistor 211 is turned on, and the first field-effect transistor 211 outputs the DC signal to the signal output unit 3 based on the AC echo signal of the negative voltage and the first voltage signal provided by the connected first voltage signal terminal 22. In this way, both the positive voltage signal and the negative voltage signal in the AC echo signal can be reliably output without additional bootstrap voltage.

In some embodiments, both of the control electrode of the first field-effect transistor 211 and the control electrode of the second field-effect transistor 212 may be gates; in the first electrode of the first field-effect transistor 211 and the second electrode of the first field-effect transistor 211, one may be a source, and the other may be a drain; and in the first electrode of the second field-effect transistor 212 and the second electrode of the second field-effect transistor 212, one may be a source, and the other may be a drain. As shown in FIG. 7, the first electrode of the first field-effect transistor 211 and the first electrode of the second field-effect transistor 212 are both sources, and the second electrode of the first field-effect transistor 211 and the second electrode of the second field-effect transistor 212 are both drains.

On this basis, as shown in FIG. 7, the gate of the first field-effect transistor 211 is connected to the receive electrode 13 of the ultrasonic sensor 1, and the operating state of the gate of the first field-effect transistor 211 is controlled by the second voltage on the receive electrode 13. That is, the potential of the gate of the first field-effect transistor 211 may be controlled by the second voltage on the receive electrode 13. The source of the first field-effect transistor 211 is connected to the first voltage signal terminal 22 to receive the first voltage signal input by the first voltage signal terminal 22. As shown in FIG. 6 and Table 1, the magnitude of the DC signal output by the inverter 21 is further related to the first voltage signal. As such, the magnitude of the DC signal output by the inverter 21 may also be adjusted by adjusting the magnitude of the first voltage signal input by the first voltage signal terminal 22. For example, the magnitude of the first voltage signal may be adjusted according to the circuit characteristics during fabrication of the ultrasonic fingerprint recognition circuit. After adjustment, the first voltage signal terminal 22 can input a stable first voltage signal. The drain of the first field-effect transistor 211 is connected to the signal output unit 3.

Likewise, as shown in FIG. 7, the gate of the second field-effect transistor 212 is connected to the receive electrode 13 of the ultrasonic sensor 1, and the operating state of the gate of the second field-effect transistor 212 is controlled by the second voltage on the receive electrode 13. That is, the potential of the gate of the second field-effect transistor 212 may also be controlled by the second voltage on the receive electrode 13. The source of the second field-effect transistor 212 is connected to the second voltage signal terminal 23 to receive the second voltage signal input by the second voltage signal terminal 23. As shown in FIG. 6 and Table 1, the magnitude of the DC signal output by the inverter 21 is further related to the second voltage signal. As such, the magnitude of the DC signal output by the inverter 21 may also be adjusted by adjusting the magnitude of the second voltage signal input by the second voltage signal terminal 23. For example, the magnitude of the second voltage signal may be adjusted according to the circuit characteristics during fabrication of the ultrasonic fingerprint recognition circuit. After adjustment, the second voltage signal terminal 23 can input a stable second voltage signal. The drain of the second field-effect transistor 212 is connected to the signal output unit 3.

Continuing to refer to Table 1, taking the first voltage signal as an example, assuming that the voltage of the first voltage signal is 4 V, the minimum input voltage of the inverter 21 VIL is 2.42 V, and the maximum input voltage of the inverter 21 VIH is 3.58 V, the minimum output voltage VOL is 0 V and the maximum output voltage VOH is 4 V corresponding to the drain of the first field-effect transistor 211.

Assuming that the voltage of the first voltage signal is 6 V, the minimum input voltage of the inverter 21 VIL is 1.74 V, and the maximum input voltage of the inverter 21 VIH is 2.32 V, the minimum output voltage VOL is 0 V and the maximum output voltage VOH is 6 V corresponding to the drain of the first field-effect transistor 211.

Assuming that the voltage of the first voltage signal is 8 V, the minimum input voltage of the inverter 21 VIL is 3.08 V, and the maximum input voltage of the inverter 21 VIH is 4.82 V, the minimum output voltage VOL is 0 V and the maximum output voltage VOH is 8 V corresponding to the drain of the first field-effect transistor 211.

Assuming that the voltage of the first voltage signal is 10 V, the minimum input voltage of the inverter 21 VIL is 3.70V, and the maximum input voltage of the inverter 21 VIH is 6.10V, then the minimum output voltage VOL is 0 V and the maximum output voltage VOH is 10 V corresponding to the drain of the first field-effect transistor 211.

Based on the above embodiments, it can be seen that the magnitude of the voltage of the DC signal output by the inverter 21 is further related to the magnitude of the first voltage signal. Likewise, the magnitude of the voltage of the DC signal output by the inverter 21 is further related to the magnitude of the second voltage signal. Thus, the voltage of the DC signal output by the inverter 21 may be further adjusted by adjusting the voltage of the first voltage signal and the voltage of the second voltage signal. In this way, the turn-on of the transistor in the signal output unit 3 can be better controlled.

In some embodiments, in the case that the threshold voltage Vth of the first field-effect transistor 211 and the threshold voltage Vth of the second field-effect transistor 212 in the inverter 21 are relatively symmetrical, it is more conducive for the inverter 21 to output the DC signal.

In other embodiments of the present disclosure, as shown in FIG. 7, the signal output unit 3 may further be connected to a third voltage signal terminal 33 and a fourth voltage signal terminal 34, respectively.

The signal output unit 3 may be configured to generate the fingerprint recognition signal and send the fingerprint recognition signal to the signal output terminal 30 of the signal output unit based on the DC signal, a third voltage signal input by the third voltage signal terminal 33, and a fourth voltage signal input by the fourth voltage signal terminal 34.

Figure 8:
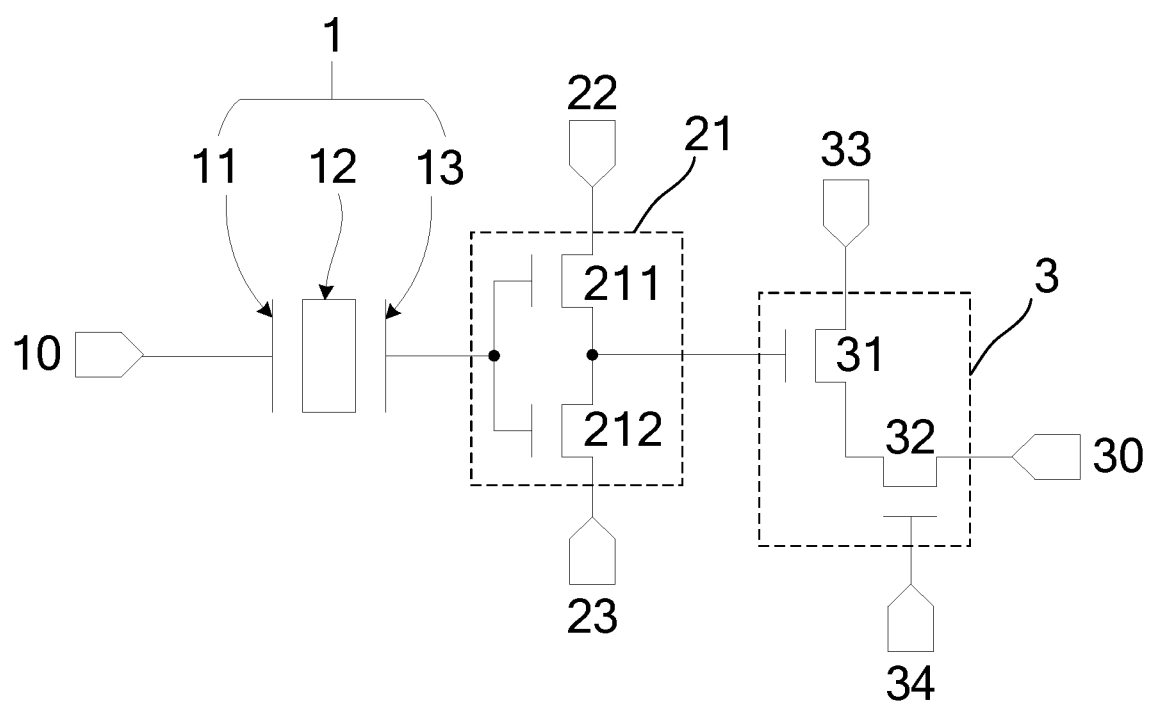
FIG. 8 is a schematic diagram of an input-output voltage curve of an inverter according to an embodiment of the present disclosure.
Figure 9:
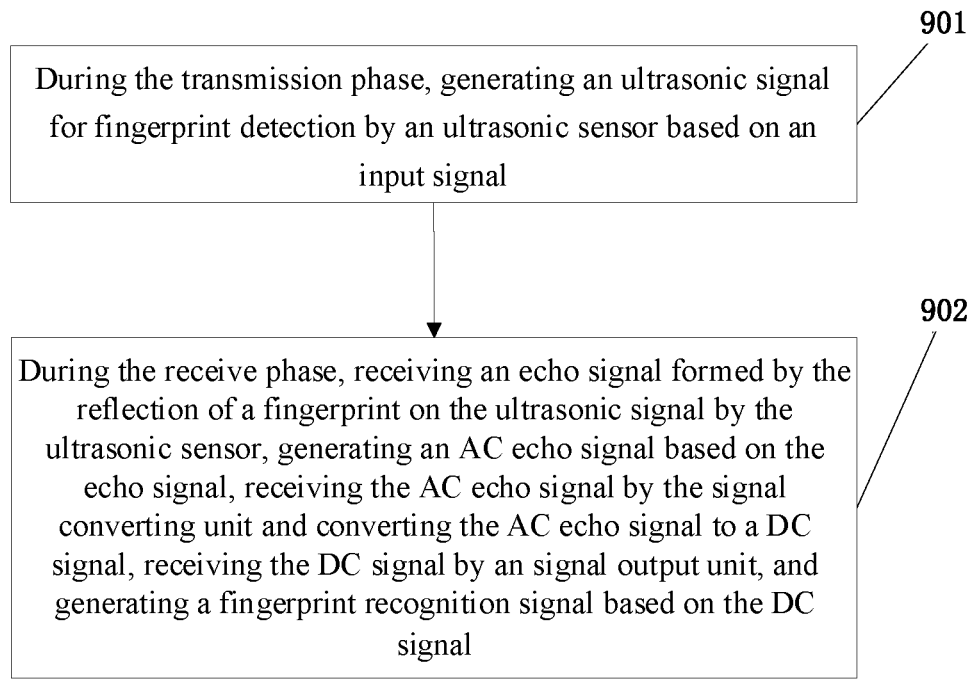
FIG. 9 is a flowchart showing a method for driving an ultrasonic fingerprint recognition circuit according to an embodiment of the present disclosure.

In other optional embodiments of the present disclosure, as shown in FIG. 8, the signal output unit 3 includes a first thin-film transistor 31 and a second thin-film transistor 32.

A control electrode of the first thin-film transistor 31 is respectively connected to the second electrode of the first field-effect transistor 211 and the second electrode of the second field-effect transistor 212, a first electrode of the first thin-film transistor 31 is connected to the third voltage signal terminal 33, and a second electrode of the first thin-film transistor 31 is connected to a first electrode of the second thin-film transistor 32.

A control electrode of the second thin-film transistor 32 is connected to the fourth voltage signal terminal 34, and a second electrode of the second thin-film transistor 32 is connected to the signal output terminal 30.

Here, both the control electrode of the first thin-film transistor 31 and the control electrode of the second thin-film transistor 32 may be gates; in the first electrode of the first thin-film transistor 31 and the second electrode of the first thin-film transistor 31, one may be a source, and the other may be a drain; and in the first electrode of the second thin-film transistor 32 and the second electrode of the second thin-film transistor 32, one may be a source, and the other may be a drain. That is, the first electrode of the first thin-film transistor 31 and the first electrode of the second thin-film transistor 32 may both be source or drain, correspondingly, the second electrode of the first thin-film transistor 31 and the second electrode of the second thin-film transistor 32 may both be drain or source.

Based on this, in combination with FIG. 8 and the above embodiments, it can be known that the gate of the first thin-film transistor 31 is respectively connected to the drain of the first field-effect transistor 211 and the drain of the second field-effect transistor 212, and the first thin-film transistor 31 may control the turn-on of the first thin-film transistor 31 by the DC signal output by at least one of the drain of the first field-effect transistor 211 and the drain of the second field-effect transistor 212. That is, the first TFT 31 may be turned on in response to the DC signal output by at least one of the drain of the first field-effect transistor 211 and the drain of the second field-effect transistor 212. Meanwhile, the third voltage signal terminal 33 inputs the third voltage signal and the fourth voltage signal terminal 34 connected to the gate of the second thin-film transistor 32 inputs the fourth voltage signal to control the second thin-film transistor 32 to turn on. Thus, under the control of the DC signal, the signal output unit 3 may generate the fingerprint recognition signal based on the DC signal and the third voltage signal, and output the fingerprint recognition signal to the signal output terminal 30.

In summary, the embodiments of the present disclosure provide an ultrasonic fingerprint recognition circuit. In the ultrasonic fingerprint recognition circuit, the signal converting unit can directly convert the AC echo signal generated by the ultrasonic sensor based on the echo signal after fingerprint detection to the DC signal, such that the signal output unit may generate the fingerprint recognition signal based on the DC signal. In this way, compared with the related art, no additional signal terminal needs to be added to perform the operation of bootstrap voltage. On the premise of not losing the negative voltage portion, the process difficulty in the circuit fabrication is further reduced.

In accordance with the same inventive concept, corresponding to the ultrasonic fingerprint recognition circuit of any of the embodiments described above, one or more embodiments of the present disclosure further provide a fingerprint recognition unit that includes at least one ultrasonic fingerprint recognition circuit as described in any of the above embodiments.

The fingerprint recognition unit of the above embodiments includes the corresponding ultrasonic fingerprint recognition circuit in any of the previous embodiments, and has the beneficial effects of the corresponding ultrasonic fingerprint recognition circuit embodiments, which will not be repeated here.

In accordance with the same inventive concept, corresponding to the ultrasonic fingerprint recognition circuit of any of the embodiments described above, one or more embodiments of the present disclosure further provide a method for driving an ultrasonic fingerprint recognition circuit, which may be applied in the ultrasonic fingerprint recognition circuit shown in FIG. 3 to FIG. 5, FIG. 7, and FIG. 8. As shown in FIG. 8, the driving method includes the following steps.

In 901, during the transmission phase, an ultrasonic signal for fingerprint detection is generated by an ultrasonic sensor based on an input signal.

Referring to FIG. 4 to FIG. 7, the ultrasonic sensor 1 includes a transmit electrode 11, a receive electrode 13, and a piezoelectric layer 12 disposed between the transmit electrode 11 and the receive electrode 13. The transmit electrode 11 is configured to receive the input signal from a signal input terminal 10 and input a first voltage to the piezoelectric layer 12 based on the input signal, wherein the input signal is an AC signal. The piezoelectric layer 12 is configured to transmit the ultrasonic signal in response to the first voltage and a second voltage on the receive electrode 13.

In 902, during the receive phase, the ultrasonic sensor receives an echo signal formed by the reflection of a fingerprint on the ultrasonic signal, and an AC echo signal is generated based on the echo signal; wherein the AC echo signal is received by a signal converting unit and converted to a DC signal; and the DC signal is received by the signal output unit, and a fingerprint recognition signal is generated based on the DC signal.

In the case that the ultrasonic signal reaches the finger of the user, the valley ridge portion of the fingerprint may reflect the ultrasonic signal to form the echo signal. In the case that the echo signal generated by the fingerprint reflection reaches the piezoelectric layer 12, the piezoelectric layer 12 may generate a vibration and a voltage variation relative to the first voltage at the interface of the piezoelectric layer 12, thereby generating the AC echo signal on the receive electrode 13 and transmit the AC echo signal to the signal converting unit 2.

As shown in FIG. 5, the signal converting unit 2 includes an inverter 21. The inverter 21 is connected to a first voltage signal terminal 22 and a second voltage signal terminal 23, respectively. The inverter 21 is configured to generate the DC signal based on the AC echo signal, a first voltage signal input by the first voltage signal terminal 22, and a second voltage signal input by the second voltage signal terminal 23, and send the DC signal to the signal output unit 3, such that the signal output unit generates the fingerprint recognition signal based on the DC signal.

In the embodiments of the present disclosure, the inverter can convert both a positive voltage signal and a negative voltage signal in the AC echo signal into a positive voltage signal, and the inverter can filter the signal. As such, as the above embodiments described, in the case that the AC echo signal is converted to the DC signal, the positive voltage and the negative voltage in the AC echo signal can be converted without additional bootstrap voltage, such that the transistor in the signal output unit 3 can be turned on more completely. In addition, as no additional signal terminal Dbias needs to be added to lift the voltage, the process difficulty in the circuit manufacturing process is further reduced.

In this case, the DC signal may further be amplified by a transition region of the inverter. That is, in the case that the voltage of the AC echo signal is present between a minimum input voltage VIL and a maximum input voltage VIH of the inverter, the output DC signal exerts an amplification effect. The amplification factor for amplifying the AC echo signal by the transition area of the inverter 21 is related to the slope of the transition area of the inverter 21, and the amplified output DC signal is related to the minimum output voltage VOL and the maximum output voltage VOH of the inverter 21, so the adjustment of the amplification factor can be achieved by adjusting a transition zone curve of the inverter 21.

Figure 10:
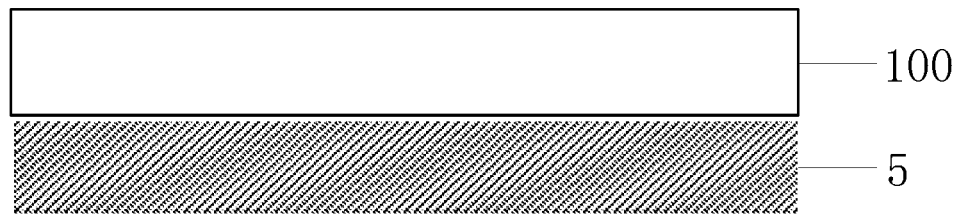
FIG. 10 is a schematic structural diagram of a display device with a fingerprint recognition unit disposed on a light emitting side of a display module according to an embodiment of the present disclosure.
Figure 11:
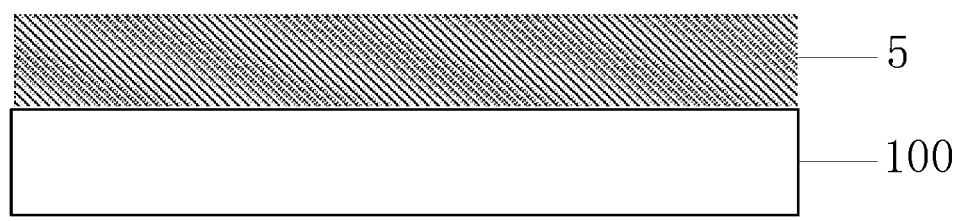
FIG. 11 is a schematic structural diagram of a display device with a fingerprint recognition unit disposed on a backlight side of a display module according to an embodiment of the present disclosure.

In accordance with the same inventive concept, corresponding to the fingerprint recognition unit of any of the embodiments described above, one or more embodiments of the present disclosure further provide a display device. As shown in FIG. 10 and FIG. 11, the display device includes a display module 5, and the fingerprint recognition unit 100 as described in any of the above embodiments.

Here, the fingerprint recognition unit 100 may be attached to either of a light emitting surface or a backlight surface of the display module 5. For example, as shown in FIG. 10, the fingerprint recognition unit 100 is attached to the light emitting surface of the display module 5; or, as shown in FIG. 11, the fingerprint recognition unit 100 is attached to the backlight surface of the display module 5.

Figure 12:
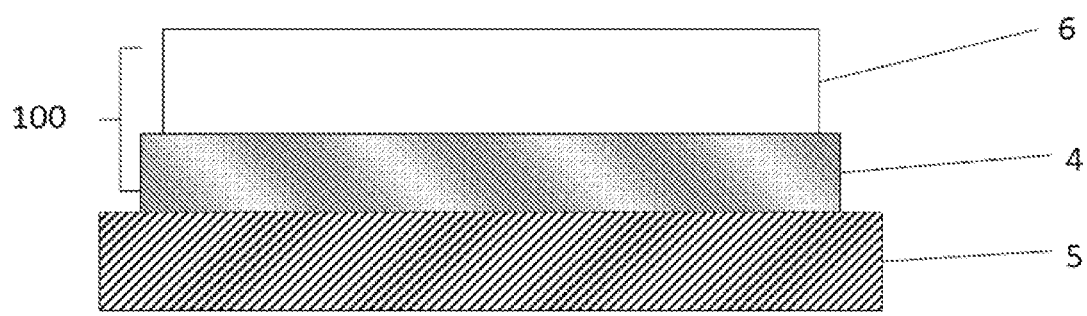
FIG. 12 is a schematic structural diagram of another display device with a fingerprint recognition unit disposed on a light emitting side of a display module according to an embodiment of the present disclosure.
Figure 13:
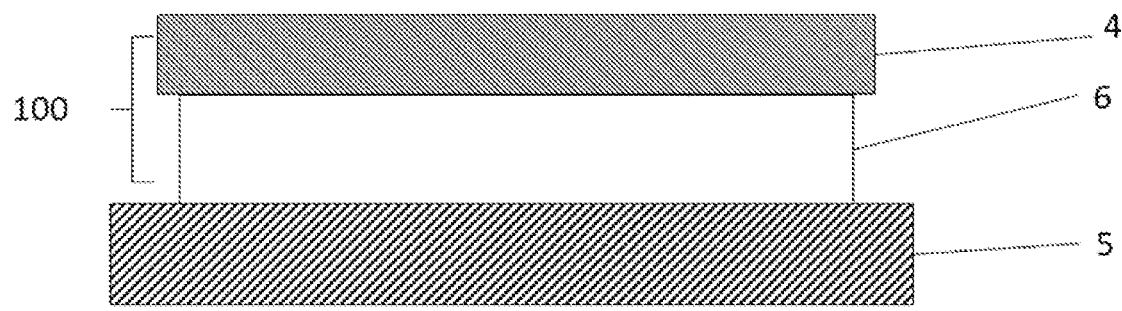
FIG. 13 is a schematic structural diagram of still another display device with a fingerprint recognition unit disposed on a light emitting side of a display module according to an embodiment of the present disclosure.
Figure 14:
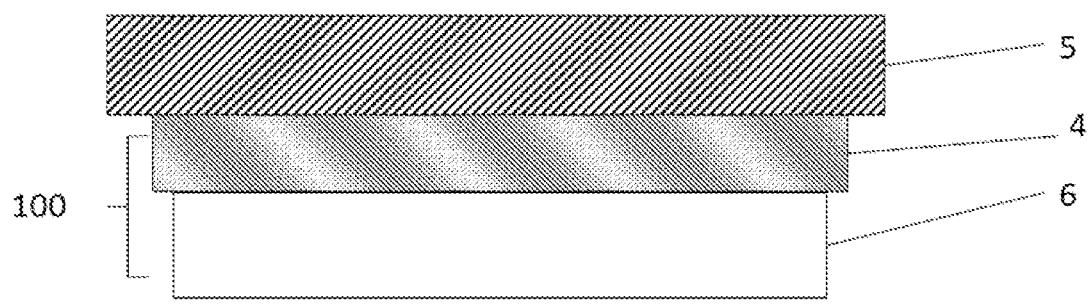
FIG. 14 is a schematic structural diagram of yet still another display device with a fingerprint recognition unit disposed on a backlight side of a display module according to an embodiment of the present disclosure.
Figure 15:
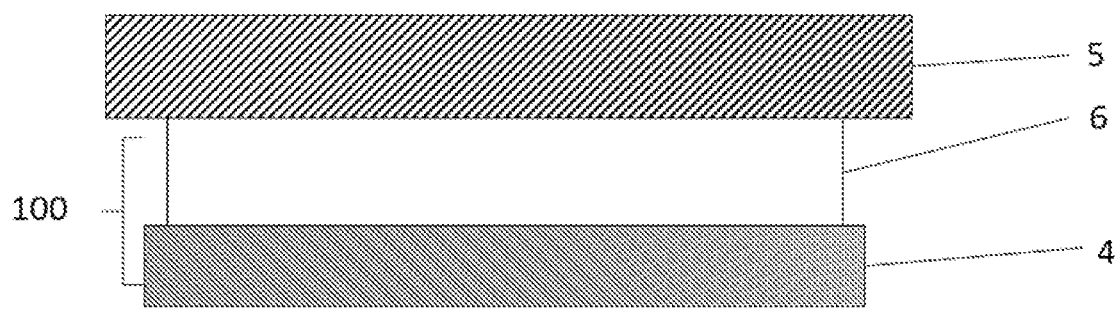
FIG. 15 is a schematic structural diagram of yet still another display device with a fingerprint recognition unit disposed on a backlight side of a display module according to an embodiment of the present disclosure.

In some embodiments, as shown in FIG. 12 to FIG. 15, the fingerprint recognition unit 100 may include a fingerprint recognition backplane 4 and an ultrasonic sensor film layer 6 disposed on a side of the display module 5 and stacked (i.e., disposed in a stacked arrangement) in sequence. The ultrasonic sensor film layer 6 may be provided with each structure of an ultrasonic sensor 1. The fingerprint recognition unit shown in FIG. 12 and FIG. 13 is attached to the light emitting surface of the display module 5, and the fingerprint recognition unit shown in FIG. 14 and FIG. 15 is attached to the backlight surface of the display module 5.

In an optional embodiment, as shown in FIG. 12 and FIG. 14, the fingerprint recognition backplane 4 may be disposed on a side of the display module 5, and the ultrasonic sensor film layer 6 may be disposed on a side, distal from the display module 5, of the fingerprint recognition backplane 4. That is, the fingerprint recognition backplane 4 and the ultrasonic sensor film layer 6 may be sequentially stacked along a direction away from the display module 5.

In another optional embodiment, as shown in FIG. 13 and FIG. 15, the ultrasonic sensor film layer 6 may be disposed on a side of the display module 5, and the fingerprint recognition backplane 4 may be disposed on a side, distal from the display module 5, of the ultrasonic sensor film layer 6. That is, the ultrasonic sensor film layer 6 and the fingerprint recognition backplane 4 may be sequentially stacked along a direction away from the display module 5. In other words, the fingerprint recognition backplane 4 may be disposed on a side of the display module 5, and the ultrasonic sensor film layer 6 may be disposed between the fingerprint recognition backplane 4 and the display module 5.

In some embodiments, as shown in FIG. 12, the fingerprint recognition backplane 4 is disposed on the light emitting surface of the display module 5, and the ultrasonic sensor film layer 6 is disposed on the side, distal from the display module 5, of the fingerprint recognition backplane 4. As shown in FIG. 13, the fingerprint recognition backplane 4 is disposed on the light emitting surface of the display module 5, and the ultrasonic sensor film layer 6 is disposed between the fingerprint recognition backplane 4 and the display module 5. As shown in FIG. 14, the fingerprint recognition backplane 4 is disposed on the backlight surface of the display module 5, and the ultrasonic sensor film layer 6 is disposed on the side, distal from the display module 5, of the fingerprint recognition backplane 4. As shown in FIG. 15, the fingerprint recognition backplane 4 is disposed on the backlight surface of the display module 5, and the ultrasonic sensor film layer 6 is disposed between the fingerprint recognition backplane 4 and the display module 5.

In some optional embodiments, as shown in FIG. 16 to FIG. 19, the display module 5 may include a display substrate 51, a pixel driving circuit unit, and a light emitting unit that are stacked sequentially. Wherein, the light emitting unit includes an anode layer, a light emitting layer, and a cathode layer 59 that are sequentially stacked along a direction away from the pixel driving circuit unit.

Figure 16:
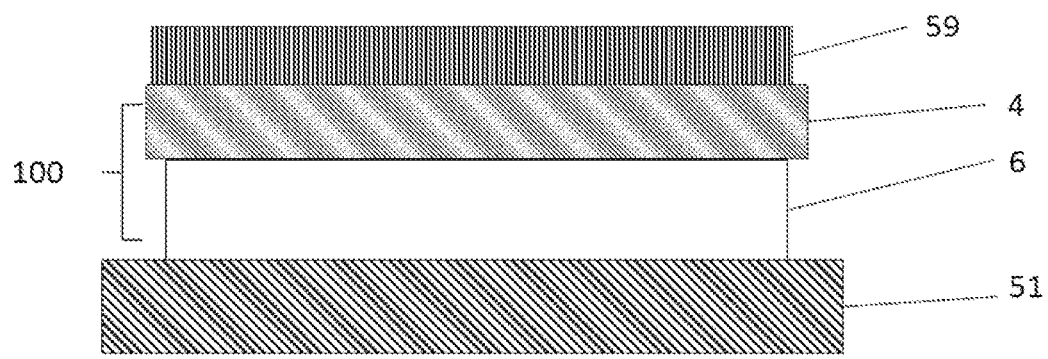
FIG. 16 is a schematic structural diagram of a display device with a fingerprint recognition unit disposed between a display substrate and a cathode layer according to an embodiment of the present disclosure.
Figure 17:
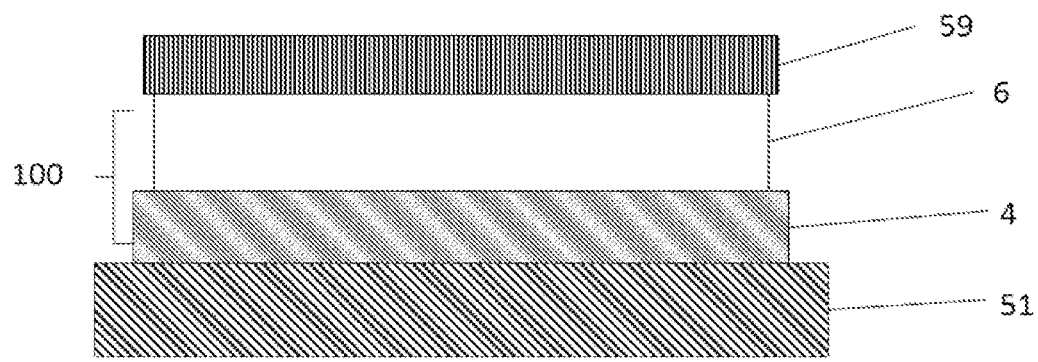
FIG. 17 is a schematic structural diagram of another display device with a fingerprint recognition unit disposed between a display substrate and a cathode layer according to an embodiment of the present disclosure.

Based on this, as shown in FIG. 16 and FIG. 17, the fingerprint recognition unit 11 includes the fingerprint recognition backplane 4 and the ultrasonic sensor film layer 6 that are stacked sequentially and disposed between the display substrate 51 and the cathode layer 59. That is, the fingerprint recognition backplane 4 and the ultrasonic sensor film layer 6 are both disposed between the display substrate 51 and the cathode layer 59.

For example, as shown in FIG. 16, the ultrasonic sensor film layer 6 is disposed between the display substrate 51 and the fingerprint recognition backplane 4. That is, the ultrasonic sensor film layer 6, the fingerprint recognition backplane 4, and the cathode layer 59 are sequentially stacked along a direction away from the display substrate 51. Alternatively, as shown in FIG. 17, the ultrasonic sensor film layer 6 is disposed between the cathode layer 59 and the fingerprint recognition backplane 4. That is, the fingerprint recognition backplane 4, the ultrasonic sensor film layer 6, and the cathode layer 59 are sequentially stacked along the direction away from the display substrate 51.

In the embodiments of the present disclosure, the fingerprint recognition backplane 4 may include each structure of a signal converting unit 2 and a signal output unit 3. That is, a first field-effect transistor 211 and a second field-effect transistor 212 in the signal converting unit 2, and a first thin-film transistor 31 and a second thin-film transistor 32 included in the signal output unit 3, and the like may be fabricated in the fingerprint recognition backplane 4. As such, each structure of the signal converting unit 2 and the signal output unit 3 may be simultaneously fabricated, thereby reducing process steps and speeding up the production efficiency.

Figure 18:
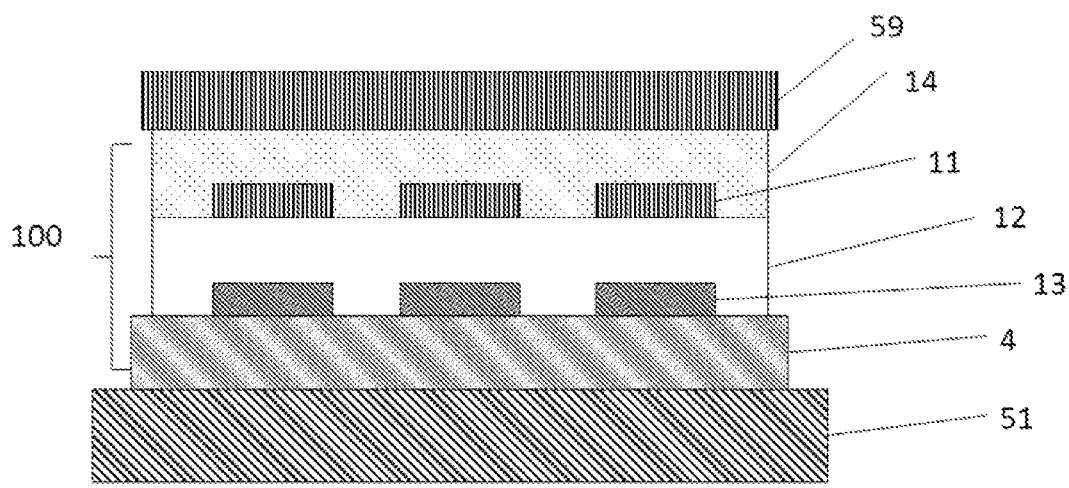
FIG. 18 is a schematic structural diagram of still another display device according to an embodiment of the present disclosure.
Figure 19:
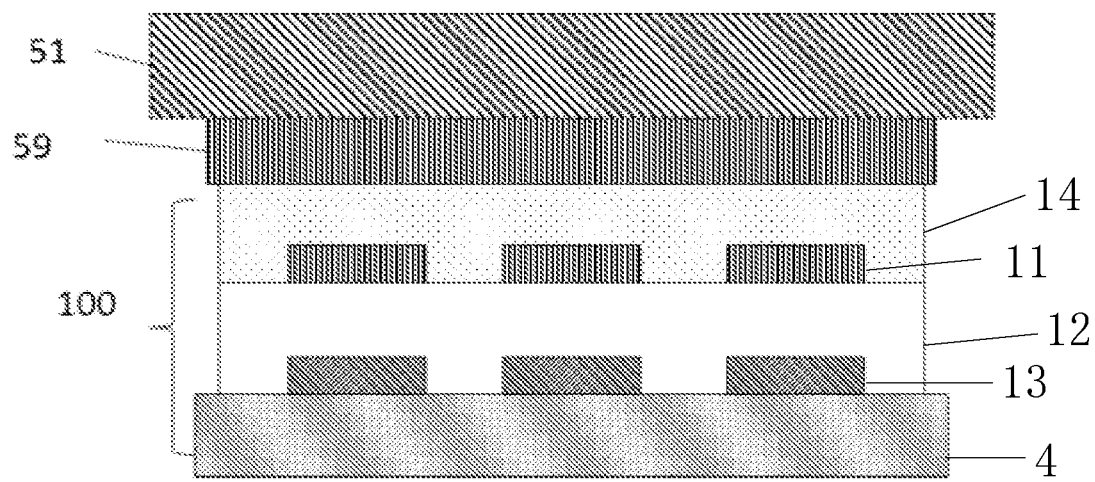
FIG. 19 is a schematic structural diagram of yet still another display device according to an embodiment of the present disclosure.

In some embodiments, as shown in FIG. 18 and FIG. 19, the ultrasonic sensor film layer 6 may include a transmit electrode 11 disposed on a side of the fingerprint recognition backplane 4, a receive electrode 13 disposed between the fingerprint recognition backplane 4 and the transmit electrode 11, and a piezoelectric layer 12 disposed between the transmit electrode 11 and the receive electrode 13.

Here, the transmit electrode 11 and the receive electrode 13 are disposed in one-to-one correspondence, and an orthographic projection of the transmit electrode 11 onto the display substrate 51 covers an orthographic projection of the receive electrode 13 onto the display substrate 51. As such, the ultrasonic signal is reliably sent and an AC echo signal is generated.

In some embodiments, in the case that the transmit electrode 11 and the receive electrode 13 and other structures are made of a non-light transmissive material, and the fingerprint recognition unit 100 is attached to the light-emitting surface of the display module 5, it is desirable to ensure that the non-light transmissive structure of the fingerprint recognition unit 100 does not obscure the light emitting unit of the display module 5. Therefore, in the case that the fingerprint recognition unit 100 is disposed on the light emitting surface of the display module 5, the orthographic projection of the emit electrode 11 onto the display substrate 51 and the orthographic projection of the receive electrode 13 onto the display substrate 51 are set to not cover an orthographic projection of the light emitting unit of the display module 5 onto the display substrate 51. Thus, the light emission efficiency of the display device is not affected during implementing the function of the fingerprint recognition.

In some embodiments, in the case that the fingerprint recognition unit 100 is disposed between the display substrate 51 and the cathode layer 59, the first field-effect transistor 211 and the second field-effect transistor 212 in the signal converting unit 2, and the first thin-film transistor 31 and second thin-film transistor 32 in the signal output unit 3 may be disposed at a same layer as the pixel circuit, the pixel driving circuit and other circuit structures in the display module 5. In this case, the fabrication of the first filed effect transistor 211, the second filed effect transistor 212, the first thin-film transistor 31, and the second thin-film transistor 32 may be simultaneously completed during fabrication of the pixel circuit, the pixel driving circuit and other circuit structures, thereby reducing the processing steps. Furthermore, each structure of the fingerprint recognition unit 100 may also be disposed in any other film layer between the display substrate 51 and the cathode layer 59, which is not limited in the embodiments of the present disclosure.

In some embodiments, as shown in FIG. 18 and FIG. 19, the ultrasonic sensor film layer 6 described in the embodiments of the present disclosure may further include a thin film encapsulation (TFE) layer 14 disposed on a side, distal from the receive electrode 13, of the transmit electrode 11. Wherein the thin film encapsulation layer 14 is configured to protect the transmit electrode 11, the piezoelectric layer 12, the receive electrode 13, and the like.

For example, as shown in FIG. 18, the fingerprint recognition backplane 4 is disposed on a side of the display substrate 51 proximate to the cathode layer 59, the receive electrode 13 is disposed on a side, distal from the display substrate 51, of the fingerprint recognition backplane 4, the transmit electrode 11 is disposed on a side, distal from the display substrate 51, of the receive electrode 13, the thin film encapsulation layer 14 is disposed on a side, distal from the receive electrode 13, of the transmit electrode 11, and the piezoelectric layer 12 is disposed between the transmit electrode 11 and the receive electrode 13. That is, the fingerprint recognition backplane 4, the receive electrode 13, the piezoelectric layer 12, the transmit electrode 11, the thin film encapsulation layer 14, and the cathode layer 59 are sequentially disposed on a side of the display substrate 51.

Or, as shown in FIG. 19, the cathode layer 59 is disposed on a side of the display substrate 51, the fingerprint recognition backplane 4 is disposed on a side, distal from the display substrate 51, of the cathode layer 59, the transmit electrode 11 is disposed between the fingerprint recognition backplane 4 and the cathode layer 59, the receive electrode 13 is disposed between the transmit electrode and the fingerprint recognition backplane 4, the thin-film encapsulation layer 14 is disposed on the side, distal from the receive electrode 13, of the transmit electrode 11, and the piezoelectric layer 12 is disposed between the transmit electrode 11 and the receive electrode 13. That is, the thin-film encapsulation layer 14, the transmit electrode 11, the piezoelectric layer 12, the receive electrode 13, and the fingerprint recognition backplane 4 are sequentially disposed on the side, distal from the display substrate 51, of the cathode layer 59.

In some embodiments, the display module 5 may be an organic light-emitting diode (OLED). Accordingly, the display substrate 51 may be an OLED display substrate. In addition, the display module 5 described in the above embodiments may be any other type of display panel.

The display device in the above embodiments includes the corresponding fingerprint recognition unit in the aforementioned embodiments, and has the beneficial effects of the corresponding fingerprint recognition unit embodiment, which will not be repeated here.

It should be understood by persons of ordinary skill in the art that the above discussion of any of the embodiments is merely exemplary and is not intended to indicate that the scope of the disclosure (including the claims) is limited to these examples; and the above embodiments, or the technical features in different embodiments may also be combined, and steps may be implemented in any order, and there are many other variations in the different aspects of the embodiments of the present disclosure as described above, which are not provided in detail for simplification.

In addition, the devices may be shown in the form of block diagrams in order to avoid making the embodiments of the present disclosure difficult to understand, and the following fact is also taken into account that the details about the practice of these block diagram devices are highly dependent on the platform on which the embodiments of the present disclosure will be implemented (that is, these details should be fully within the understanding of those skilled in the art). In the case where specific details (for example, circuits) are set forth to describe exemplary embodiments of the present disclosure, it is obvious to those skilled in the art that the embodiments of the present disclosure may be implemented without these specific details or with variation of these specific details. Therefore, these descriptions should be considered as illustrative instead of limiting.

Although the present disclosure has been described in conjunction with specific embodiments of the present disclosure, based on the foregoing description, many substitutions, modifications and variations of these embodiments will be apparent to those of ordinary skill in the art.

The embodiments of the present disclosure are intended to cover all such substitutions, modifications and variations that fall within the broad scope of the appended claims. Therefore, any omission, modification, equivalent replacement, improvement, etc. made within the spirit and principle of the embodiments of the present disclosure should be included in the protection scope of the present disclosure.

What is claimed is:

1. An ultrasonic fingerprint recognition circuit, comprising:
    an ultrasonic sensor, wherein the ultrasonic sensor is configured to generate an ultrasonic signal for fingerprint detection based on an input signal, and generate an AC echo signal based on an echo signal formed by reflection of the ultrasonic signal by a fingerprint;
    a signal converting unit, wherein one end of the signal converting unit is connected to the ultrasonic sensor, and the signal converting unit is configured to receive the AC echo signal and convert the AC echo signal to a DC signal; and
    a signal output unit, wherein the signal output unit is connected to the other end of the signal converting unit, and the signal output unit is configured to receive the DC signal and generate a fingerprint recognition signal based on the DC signal,
    wherein the signal converting unit comprises: an inverter;
    wherein the inverter is connected to a first voltage signal terminal and a second voltage signal terminal, and the inverter is configured to convert a positive voltage signal and a negative voltage signal in the AC echo signal to the DC signal based on a first voltage signal input by the first voltage signal terminal and a second voltage signal input by the second voltage signal terminal, and wherein the first voltage signal and the second voltage signal are configured to adjust magnitude of the DC signal.

2. The ultrasonic fingerprint recognition circuit according to claim 1, wherein the ultrasonic sensor comprises: a transmit electrode, a receive electrode, and a piezoelectric layer disposed between the transmit electrode and the receive electrode; wherein
    the transmit electrode is configured to receive the input signal and input a first voltage to the piezoelectric layer based on the input signal, and the input signal is an AC signal;
    the piezoelectric layer is configured to generate and transmit the ultrasonic signal in response to the first voltage and a second voltage on the receive electrode, and generate a voltage variation relative to the first voltage in response to the echo signal formed by the reflection of the ultrasonic signal by the fingerprint; and
    the receive electrode is connected to the signal converting unit, and the receive electrode is configured to generate the AC echo signal based on the voltage variation, and output the AC echo signal to the signal converting unit.

3. The ultrasonic fingerprint recognition circuit according to claim 1, wherein the inverter comprises a first field-effect transistor and a second field-effect transistor; wherein
    a control electrode of the first field-effect transistor is connected to the ultrasonic sensor, a first electrode of the first field-effect transistor is connected to the first voltage signal terminal, and a second electrode of the first field-effect transistor is connected to the signal output unit; and
    a control electrode of the second field-effect transistor is connected to the ultrasonic sensor, a first electrode of the second field-effect transistor is connected to the second voltage signal terminal, and a second electrode of the second field-effect transistor is connected to the signal output unit.

4. The ultrasonic fingerprint recognition circuit according to claim 3, wherein in the first field-effect transistor and the second field-effect transistor, one field-effect transistor is a P-type field-effect transistor and the other field-effect transistor is an N-type field-effect transistor.

5. The ultrasonic fingerprint recognition circuit according to claim 3, wherein
    the control electrode of the first field-effect transistor and the control electrode of the second field-effect transistor are both gates;
    in the first electrode of the first field-effect transistor and the second electrode of the first field-effect transistor, one is a source and the other is a drain; and
    in the first electrode of the second field-effect transistor and the second electrode of the second field-effect transistor, one is a source and the other is a drain.

6. The ultrasonic fingerprint recognition circuit according to claim 1, wherein the signal output unit is further connected to a third voltage signal terminal and a fourth voltage signal terminal, and the signal output terminal is configured to generate the fingerprint recognition signal based on the DC signal, a third voltage signal input by the third voltage signal terminal, and a fourth voltage signal input by the fourth voltage signal terminal, and send the fingerprint recognition signal to a signal output terminal of the signal output unit.

7. The ultrasonic fingerprint recognition circuit according to claim 6, wherein the signal output unit comprises a first thin-film transistor and a second thin-film transistor; wherein
a control electrode of the first thin-film transistor is connected to the signal converting unit, a first electrode of the first thin-film transistor is connected to the third voltage signal terminal, and a second electrode of the first thin-film transistor is connected to a first electrode of the second thin-film transistor; and
a control electrode of the second thin-film transistor is connected to the fourth voltage signal terminal, and a second electrode of the second thin-film transistor is connected to the signal output terminal.

8. The ultrasonic fingerprint recognition circuit according to claim 7, wherein
both the control electrode of the first thin-film transistor and the control electrode of the second thin-film transistor are gates;
in the first electrode of the first thin-film transistor and the second electrode of the first thin-film transistor, one is a source and the other is a drain; and
in the first electrode of the second thin-film transistor and the second electrode of the second thin-film transistor, one is a source and the other is a drain.

9. The ultrasonic fingerprint recognition circuit according to claim 8, wherein
the ultrasonic sensor comprises: a transmit electrode, a receive electrode, and a piezoelectric layer disposed between the transmit electrode and the receive electrode; wherein
the transmit electrode is configured to receive the input signal and input a first voltage to the piezoelectric layer based on the input signal, and the input signal is an AC signal;
the piezoelectric layer is configured to generate and transmit the ultrasonic signal in response to the first voltage and the second voltage on the receive electrode, and generate a voltage variation relative to the first voltage in response to the echo signal formed by the reflection of the ultrasonic signal by the fingerprint;
the receive electrode is connected to the signal converting unit, and the receive electrode is configured to generate the AC echo signal based on the voltage variation, and output the AC echo signal to the signal converting unit; and
the inverter comprises a first field-effect transistor and a second field-effect transistor; wherein a control electrode of the first field-effect transistor is connected to the ultrasonic sensor, a first electrode of the first field-effect transistor is connected to the first voltage signal terminal, and a second electrode of the first field-effect transistor is connected to the signal output unit; a control electrode of the second field-effect transistor is connected to the ultrasonic sensor, a first electrode of the second field-effect transistor is connected to the second voltage signal terminal, and a second electrode of the second field-effect transistor is connected to the signal output unit; in the first field-effect transistor and the second field-effect transistor, one field-effect transistor is a P-type field-effect transistor, and the other field-effect transistor is an N-type field-effect transistor; the control electrode of the first field-effect transistor and the control electrode of the second field-effect transistor are both gates; in the first electrode of the first field-effect transistor and the second electrode of the first field-effect transistor, one is a source, and the other is a drain; and in the first electrode of the second field-effect transistor and the second electrode of the second field-effect transistor, one is a source, and the other one is a drain.

10. A method for driving an ultrasonic fingerprint recognition circuit, applicable to the ultrasonic fingerprint recognition circuit, wherein the ultrasonic fingerprint recognition circuit comprises: an ultrasonic sensor, a signal converting unit, and a signal output unit, one end of the signal converting unit being connected to the ultrasonic sensor, and the signal output unit being connected to the other end of the signal converting unit;
the method comprising:
in a transmission phase, generating an ultrasonic signal for fingerprint detection by the ultrasonic sensor based on an input signal; and
in a reception phase, receiving an echo signal formed by the reflection of a fingerprint on the ultrasonic signal by the ultrasonic sensor, and generating an AC echo signal based on the echo signal; receiving the AC echo signal by the signal converting unit and converting the AC echo signal to a DC signal; and receiving the DC signal by the signal output unit, and generating a fingerprint recognition signal based on the DC signal,
wherein the signal converting unit comprises: an inverter;
wherein the inverter is connected to a first voltage signal terminal and a second voltage signal terminal, and the inverter is configured to convert a positive voltage signal and a negative voltage signal in the AC echo signal to the DC signal based on a first voltage signal input by the first voltage signal terminal and a second voltage signal input by the second voltage signal terminal, and wherein the first voltage signal and the second voltage signal are configured to adjust magnitude of the DC signal.

11. A display device, comprising: a display module and a fingerprint recognition unit, wherein the fingerprint recognition unit is attached to either a light emitting surface or a backlight surface of the display module; wherein the fingerprint recognition unit comprises: an ultrasonic fingerprint recognition circuit;
the ultrasonic fingerprint recognition circuit comprising:
an ultrasonic sensor, wherein the ultrasonic sensor is configured to generate an ultrasonic signal for fingerprint detection based on an input signal, and generate an AC echo signal based on an echo signal formed by reflection of the ultrasonic signal by a fingerprint;
a signal converting unit, wherein one end of the signal converting unit is connected to the ultrasonic sensor, and the signal converting unit is configured to receive the AC echo signal and convert the AC echo signal to a DC signal; and
a signal output unit, wherein the signal output unit is connected to the other end of the signal converting unit, and the signal output unit is configured to receive the DC signal and generate a fingerprint recognition signal based on the DC signal,
wherein the signal converting unit comprises: an inverter;
wherein the inverter is connected to a first voltage signal terminal and a second voltage signal terminal, and the inverter is configured to convert a positive voltage signal and a negative voltage signal in the AC echo signal to the DC signal based on a first voltage signal input by the first voltage signal terminal and a second voltage signal input by the second voltage signal terminal, and wherein the first voltage signal and the second voltage signal are configured to adjust magnitude of the DC signal.

12. The display device according to claim 11, wherein the fingerprint recognition unit comprises a fingerprint recognition backplane and an ultrasonic sensor film layer that are disposed on a side of the display module and are stacked in sequence.

13. The display device according to claim 12, wherein the fingerprint recognition backplane is disposed on a side of the display module, and the ultrasonic sensor film layer is disposed on a side, distal from the display module, of the fingerprint recognition backplane.

14. The display device according to claim 12, wherein the ultrasonic sensor film layer is disposed on a side of the display module, and the fingerprint recognition backplane is disposed on a side, distal from the display module, of the ultrasonic sensor film layer.

15. The display device according to claim 12, wherein
the display module comprises a display substrate, a pixel driving circuit unit, and a light emitting unit that are sequentially stacked;
the light emitting unit comprises an anode layer, a light emitting layer, and a cathode layer that are sequentially stacked along a direction away from the pixel driving circuit unit; and
the fingerprint recognition backplane and the ultrasonic sensor film layer are disposed between the display substrate and the cathode layer.

16. The display device according to claim 15, wherein
the fingerprint recognition backplane comprises a signal converting unit and a signal output unit; and
the ultrasonic sensor film layer comprises a transmit electrode disposed on a side of the fingerprint recognition backplane, a receive electrode disposed between the fingerprint recognition backplane and the transmit electrode, and a piezoelectric layer disposed between the transmit electrode and the receive electrode.

17. The display device according to claim 16, wherein the transmit electrode and the receive electrode are disposed in one-to-one correspondence, and an orthographic projection of the transmit electrode onto the display substrate covers an orthographic projection of the receive electrode onto the display substrate.

18. The display device according to claim 16, wherein
the fingerprint recognition unit is attached to a light-emitting surface of the display module; and
both an orthographic projection of the receive electrode onto the display substrate and an orthographic projection of the transmit electrode onto the display substrate are not overlapped with an orthographic projection of the light emitting unit onto the display substrate.

19. The display device according to claim 16, wherein the ultrasonic sensor film layer further comprises a thin film encapsulation layer disposed on a side, distal from the receive electrode, of the transmit electrode.

* * * * *